United States Patent [19]

Hartig et al.

[11] Patent Number: 4,534,841
[45] Date of Patent: Aug. 13, 1985

[54] SOLAR CONTROLLED GLAZING AND METHOD OF PRODUCING GLAZING

[75] Inventors: Klaus Hartig, Ronneburg; Anton Dietrich; Michael Scherer, both of Rodenbach, all of Fed. Rep. of Germany

[73] Assignee: Leybold-Heraeus GmbH, Cologne, Fed. Rep. of Germany

[21] Appl. No.: 592,907

[22] Filed: Mar. 23, 1984

[30] Foreign Application Priority Data

Mar. 31, 1983 [DE] Fed. Rep. of Germany ....... 3311815

[51] Int. Cl.³ ............................................... C23C 15/00
[52] U.S. Cl. ............................ 204/192 P; 204/192 R; 204/298; 428/426; 428/436
[58] Field of Search .................... 428/432, 426; 204/192 P, 298

[56] References Cited

U.S. PATENT DOCUMENTS

| | | | |
|---|---|---|---|
| 3,897,325 | 7/1975 | Aoshima | 204/192 P |
| 3,904,506 | 9/1975 | Carmichael | 204/192 P |
| 3,907,660 | 9/1975 | Gillery | 204/298 |
| 3,934,961 | 1/1976 | Itoh et al. | 428/432 |
| 4,022,947 | 5/1977 | Grubb et al. | 204/192 P |
| 4,048,039 | 9/1977 | Daxinger | 204/192 P |
| 4,093,349 | 6/1978 | Mills | 204/192 P |
| 4,093,504 | 6/1978 | Ponjeé et al. | 204/192 P |
| 4,101,200 | 7/1978 | Daxinger | 204/192 P |
| 4,161,560 | 6/1979 | Kienel | 428/432 |
| 4,237,183 | 12/1980 | Fujiwara et al. | 428/432 |
| 4,248,687 | 2/1981 | Fan | 204/192 P |
| 4,279,726 | 7/1981 | Baird et al. | 204/192 P |

Primary Examiner—Arthur P. Demers
Attorney, Agent, or Firm—Felfe & Lynch

[57] ABSTRACT

Solar-controlled glazing having a transmission of between 5 and 40% in the visible spectrum range and having heat-reflection properties is produced by applying an oxide layer having an optical thickness of between 20 and 280 nm directly to a transparent substrate by cathodic evaporation in an oxygen-containing atmosphere to form a first layer. A chromium nitride layer having a geometric thickness of between 10 and 40 nm is then applied in an atmosphere consisting of inert gas and nitrogen to provide a second layer. An optical third dielectric layer may be applied to the second layer. The oxide layer is selected from oxides of tin, titanium and aluminium.

7 Claims, 3 Drawing Figures

SOLAR CONTROLLED GLAZING AND METHOD OF PRODUCING GLAZING

FIELD OF THE INVENTION

The invention concerns a method of producing glazing having a transmission of between 5 and 40% in the visual spectrum range and having heat reflection properties, by coating transparent substrates by cathodic sputtering, and to the glazing itself.

Glazing of this kind has a colour-neutral and low transmission in the visual spectrum range and is advantageously used in areas having a continental climate, i.e. extremely hot summers and cold winters. This glazing is known as "solar-controlled glazing".

BACKGROUND OF THE PRIOR ART

It is known to use metals selected from the group containing gold, silver and copper to provide the actual active layers. These layers are arranged between an adhesive layer and a protective layer, and the adhesive layer may likewise possess optical properties and can consist, for example, of a metal such as chromium or of a dielectric. Dielectric material is normally used for the protective layer (DE-AS No. 2029181 and DE-AS No. 2334152). Such layers suffer from the disadvantage of flecking, which varies in intensity depending upon the metal used for the active layer and which, within the available range, can only be avoided or modified with difficulty. Marked changes in colour characteristic lead to pronounced variations in the reflection and tranmission behaviour, since these optical properties are closely linked with the colour characteristic of the glazing.

It is also known to dispense with a purely metallic layer and to produce colour-neutral layers which reflect a high infra-red proportion of the radiation. This is achieved by means of a first layer of indium-tin oxide which is reinforced by a second layer consisting of at least one of the oxides of tin, bismuth, titanium and tantalum. However, the transmission values are above 70%, and furthermore the colour impressions cannot be intentionally varied (DE-OS No. 32 01 783).

OBJECT OF THE INVENTION

The object of the present invention is therefore to provide a method of producing glazing of the initially described kind, i.e. having a very low transmission, by which method either the colour characteristic or the transmission behaviour in the visual range or the infra-red reflection values in the heat-radiation range are optionally variable, without the optical values associated with the uninfluenced characteristics also being changed.

SUMMARY OF THE INVENTION

A method of producing glazing having a transmission of between 5 and 40% in the visual spectrum range and having heat-reflection properties comprising the steps of applying at least first and second coating layers to a transparent substrate by cathode sputtering, said first layer comprising an oxide layer having an optical thickness of between 20 and 280 nm and applied by sputtering directly to the substrate in an oxygen-containing atmosphere, and said second layer comprising a chromium nitride layer having a geometric thickness of between 10 and 40 nm applied by sputtering in an atmosphere consisting of an inert gas and nitrogen.

A window pane having a transmission of between 5 and 40% in the visual spectrum range and having heat-reflection properties, comprising a glass pane, a first oxide layer which is located on the glass pane and has an optical thickness of between 20 and 280 nm, and a second, chromium nitride layer having a geometric thickness of between 10 and 40 nm.

DESCRIPTION OF THE PREFERRED EMBODIMENT

Figure 1:
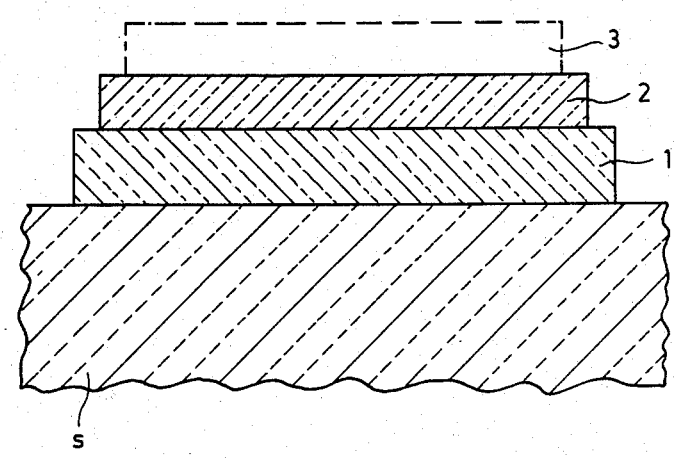
FIG. 1 shows a cross-section through a layer system in glazing accordance with the invention.

The layer system in accordance with the invention, which can be produced by the process of cathodic evaporation involving the normal parameters results, for example, in it becoming possible to adjust the outward appearance of the reflection colour of the glazing when the transmission colour is neutral by appropriate choice of the optical thickness of the oxide layer, the colour characteristic extending from silver through bronze and blue to green if the optical thickness of the layer is gradually increased from 20 nm to 280 nm. The transmission values in the visual range and the reflection values in the heat-radiation range can be caused to remain unchanged if the geometric thickness of the chromium nitride layer and the composition of the atomizing gas remains unchanged during production of the chromium nitride layer. Great store is set upon such possibility by architects who wish to impart a very specific charcteristic to a building that is to be glazed, specific transmission and reflection values being retained. Furthermore, the method of the invention can be carried out on a largely reproducible basis.

The decisive factor here is the optical thickness, defined as the actual or geometric thickness, multiplied by the refractive index "n" of the oxide used. By dividing the optical thickness by the refractive index "n" it is possible in this way easily to determine the geometric thickness "d" which is used as a basis for controlling the sputter parameters which ultimately determine the properties of the layers. The geometric layer thickness is given for the chromium nitride layer, since no dielectric is involved here.

Oxides from the group listed in Table I with the refractive indices and ranges for the geometric and optical thickness listed are given preferential consideration as the oxides for the first layer:

TABLE I

| Oxide | Optical Thickness (nm) | Refractive Index | Geometric Thickness (nm) |
|---|---|---|---|
| $SnO_2$ | 20–280 | 2 | 10–140 |
| $TiO_2$ | 20–280 | 2.3 | 8–122 |
| $Al_2O_3$ | 20–280 | 1.7 | 12–165 |

On the other hand, when the reflection colour is constant, the transmission values can be varied over a wide range if the geometric thickness of the chromium nitride layer is correspondingly varied, with the thickness of the oxide layer and the composition of the gas remaining unchanged during production of the chromium nitride layer. Thus, a geometric thickness of the chromium nitride layer of 19 nm corresponds to a transmission of 15%, and a geometric thickness of the chromium nitride layer of 12 nm corresponds to a transmission of 30%.

Finally, it is again possible, with the reflection colour and the transmission values unchanged in the visual range, to vary the infra-red reflection values in the heat-radiation range. This takes place, with the thickness of the oxide layer remaining unchanged and also with unchanged thickness of the chromium nitride layer, by altering the gas composition during application of the chromium nitride layer by atomization. Thus, for example, with a relationship $Ar:N_2=0.20$, an IR-reflection of 10% can be achieved, whereas with a relationship $Ar:N_2$ of 0.60, an IR-reflection of 45% can be achieved.

Expressed in simple terms, the method of the invention permits separation of the procedures during the setting of specific optical properties—whether the reflection colour i.e. the characteristic, the transmission value in the visual range, or the infra-red reflection value in the heat-radiation range. Thus, with only two different layer materials, i.e. either tin, titanium or aluminium or their oxides and chromium or chromium nitride it is possible to obtain window panes having very different but specific optical properties, simply by appropriate selection of the layer thickness or the coating period, and by appropriate selection of the composition of the atomizing gas.

Targets of the metal concerned are used in the conventional manner for producing the oxide layer and are atomized in an oxygen-containing atmosphere. Similarly, targets of chromium are atomized in a nitrogen-containing atmosphere for producing the chromium nitride layers.

Chromium nitride offers excellent mechanical resistance to grinding or scratching. A chromium nitride layer is also extremely resistant to chemical agents such as chlorine, sulphur, acids and lyes. However, the mechanical and chemical resistance can be further improved by applying, to the chromium nitride layer, a third layer consisting of a dielectric, and preferably of one of the above-mentioned oxides. This layer may also form an anti-reflection layer.

As regards the infra-red reflection values, further described above, in no way should a chromium nitride layer having a stoichiometric relationship between chromium and nitrogen be involved, since the chromium nitride layer can be relatively heavily saturated with nitrogen.

Referring now to FIG. 1 of the drawings, there is shown an embodiment of a glazing according to the invention comprising a substrate S in the form of a pane of mineral glass. Directly located on the substrate is a first, oxide layer 1 to which a second layer 2 of chromium nitride is directly applied by atomization. A third layer 3, indicated in broken lines, may also be applied to this second layer, the third layer preferably consisting of the same material as the first layer. All of the layers are applied by a cathode sputtering method which as such forms part of the prior art.

To obtain a transmission of between 5 and 40%, and preferably between 8 and 30%, in the visual spectrum range the first layer 1 preferably consists of an oxide of tin, titanium or aluminium applied directly to the substrate S in an oxygen-containing atmosphere and has an optical thickness of between 20 and 280 nm. The second layer 2 of chromium nitride is applied by atomization in an atmosphere consisting of an inert gas and nitrogen and has a geometric thickness of between 10 and 40 nm.

The outward appearance of the reflection colour of the pane is set by appropriate choice of the optical thickness of the oxide layer, a layer thickness of 20 nm corresponding to colour "silver", 80 nm to the colour "bronze", 200 nm to the colour "blue" and 240 nm to the colour "green".

The transmission value of the pane is established by the thickness of the chromium nitride layer, typically 19 nm corresponding to a transmission of 15% and 12 nm to a transmission of 30%. The infra-red reflection value of the pane is set by selecting the appropriate composition of the inert gas/nitrogen atmosphere in which the chromium nitride layer is applied, typically an I.R. reflection of 10% being obtained when the composition of the atomizing gas $Ar:N_2=0.20$, and an I.R. reflection of 45% when $Ar:N_2=0.60$.

The following Example will further illustrate the present invention.

EXAMPLE 1

First and second layers 1 and 2 as shown in FIG. 1 (without layer 3) were deposited on a glass pane 40 cm square in a Type A 900 H cathodic sputtering installation (manufacturers: Messrs Leybold-Heraeus GmbH of Hanau, Federal Republic of Germany), by sputtering targets of pure tin and chromium in turn. The glass pane was moved relative to the targets i.e. to the cathodes. Sputtering of the tin was carried out in an oxygen-containing atmosphere so that tin oxide layers were deposited. The chromium target was sputtered in an Argon/Nitrogen atmosphere $Ar:N_2=0.55$ so that a layer resistance of 0.12 k$\Omega$ was established. The geometric thickness of the chromium nitride layer was 15 nm, setting a transmission of 20% in the visible range at a measuring light wavelength of 550 nm.

EXAMPLES 2 TO 4

The procedure of Example 1 was repeated but the thickness of the interference layer 1, consisting of tin oxide, was varied.

The following Table II shows, in respect of Examples 1 to 4, the geometric thickness of the respective tin oxide layers, the colour characteristics indicated therein being for quality and quantity (the latter in Cielab units):

TABLE II

| Example No. | Geometric Thickness of SnO$_2$ layer (nm) | Transmission at 550 nm (%) | Colour Characteristic | Colour Values Glass Side | |
|---|---|---|---|---|---|
| | | | | A* | B* |
| 1 | 10 | 19 | Silver | −1.50 | 1.69 |
| 2 | 40 | 23 | Bronze | −0.06 | 9.44 |
| 3 | 100 | 21 | Blue | −4.17 | −12.40 |
| 4 | 120 | 21 | Green | −7.43 | −2.78 |

The above-mentioned Cielab units were determined by a measuring method which has been developed during recent years by the manufacturers of surface coatings. The method is a colorimetric measuring method wherein a measuring light beam from a standardized light source with very specific spectral properties is directed on to the object to be measured and the reflected proportions of measuring light in the optically visible wavelength of the spectrum are analyzed. Depending upon the sign, A* designates the red proportion or green proportion and B* the yellow proportion or blue proportion in the reflected measuring light.

The principles of the measuring method are described for example by R. M. German, M. M. Guzowsky and D. C. Wright in "Journal of Metals", March 1980, pages 20 et seq. as well as by the same authors in "Gold Bulletin", July 1980, pages 113 et seq. Several manufacturers of series-produced equipment for colour measurements are listed in the "Handbook of Optics" by Walter G. Driscol and W. Vaughan, McGraw-Hill Book Company, Edition 1978, Chapter 9. Instruments with analysis means, using Ceilab units in particular, are marketed by the following firms:

| | |
|---|---|
| Mac Beth | (Newburgh, N.Y./USA) |
| Hunterlab | (Reston, Virginia/USA) |
| Instr. Colour Syst. | (Newbury, Berkshire/GB) |
| Diano Corp. | (USA - Type Match Scan DTM 1045) |

Table II quite clearly shows the change in the colour characteristic from silver through bronze and blue to green, transmission being substantially constant at between 90 and 23%.

EXAMPLES 5 TO 8

In the same way as in Examples 1 to 4, a total of four substrates having a bronze tone were produced with a thickness of tin oxide layer of 40 nm, as in Example 2. The thickness of the chromium nitride layer (absorption layer) was now varied as will be seen from the following Table III. These examples are related to a surface resistance of 0.110 kΩ at 20% transmission:

TABLE III

| Example No. | Thickness of CrN layer (nm) | Transmission at 550 nm (%) |
|---|---|---|
| 5 | 19 | 15 |
| 6 | 15 | 20 |
| 7 | 14 | 25 |
| 8 | 12 | 30 |

The layer system of Example No. 5 leads to a very "dark" pane which permits the passage of only 15% of visual light at a measuring light wavelength of 550 nm. The layer system of Example 8 lets through twice the amount of light, and the pane is therefore correspondingly "brighter".

EXAMPLES 9 TO 16

Figure 2:
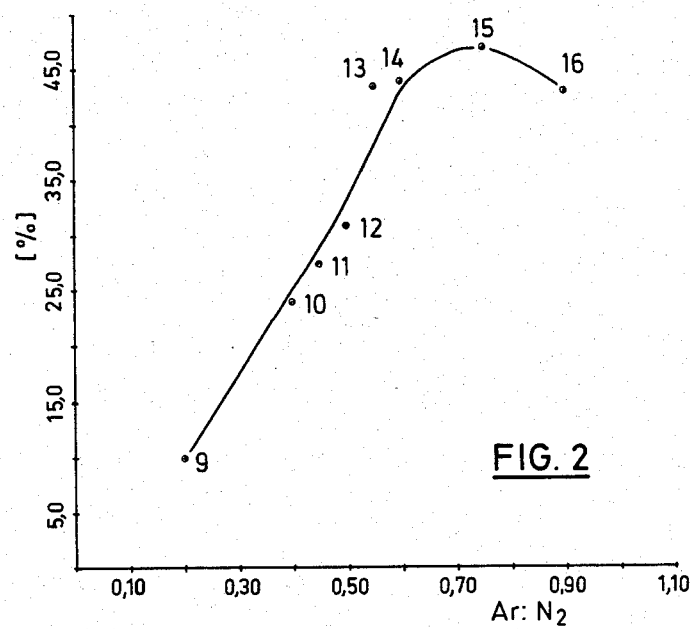
FIG. 2 shows, by means of a graph, the relationship between the infra-red reflection and the composition of the atomizing gas $Ar:N_2$.
Figure 3:
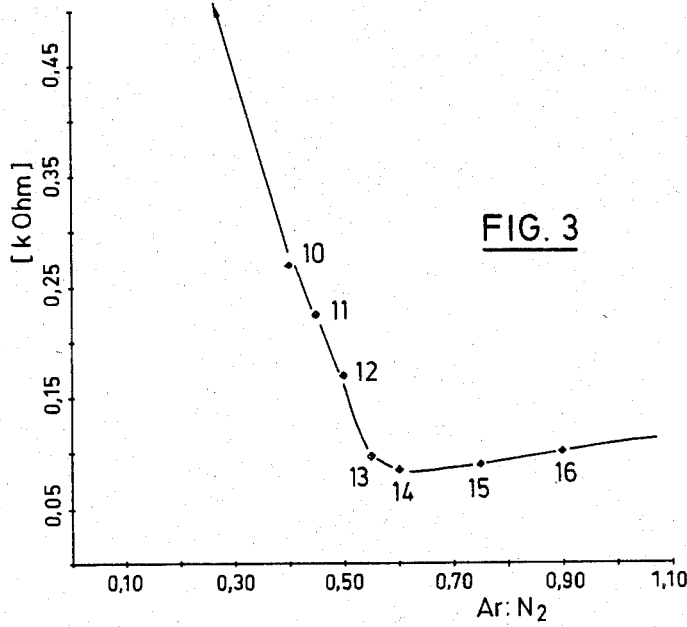
FIG. 3 shows, by means of a graph, the relationship between the resistance of a layer and the composition of the atomizing gas $Ar:N_2$.

The procedure of Example 2 was repeated with a thickness of chromium nitride layer of 14 nm as in Example 7 but in each of the eight Examples (Nos. 9 to 16) the composition of the atomizing gas Ar:$N_2$ was varied between 0.20 and 0.90 as shown in FIG. 2. This resulted in a change in the infra-red reflection of from 10% to about 47%. The measured values are shown in the form of a graph in FIG. 2, and it will be seen from this that as the nitrogen content of the atomizing atmosphere decreases, the infra-red reflection increases sharply to a maximum value of approximately 47% and then drops again. The change in the resistance of the layers in kΩ is shown in FIG. 3.

EXAMPLES 17 AND 18

Example 3 was repeated but with the difference that instead of the tin oxide layer having a geometric thickness of 100 nm, respectively a titanium dioxide layer having a geometric thickness of 87 nm and an aluminium oxide layer having a geometric thickness of 118 nm were applied by sputtering. In all cases the optical thickness was approximately 200 nm, and the characteristic colour as viewed from the exterior was blue.

We claim:

1. A method of producing glazing having a transmission of between 5 and 40% in the visual spectrum range and heat-reflection properties, comprising the steps of applying at least first and second coating layers to a transparent substrate by cathode sputtering, said first layer comprising an oxide layer having an optical thickness of between 20 and 280 nm and applied by cathode sputtering directly to the substrate in an oxygen-containing atmosphere, and said second layer comprising a chromium nitride layer having a geometric thickness of between 10 and 40 nm applied by cathode sputtering in an atmosphere consisting of an inert gas and nitrogen.

2. A method according to claim 1, including the step of applying a third layer consisting of a dielectric to said chromium nitride second layer by cathode sputtering.

3. A method according to claim 2, wherein the first and the third layers consist of an oxide selected from the group comprising the oxides of tin, titanium and aluminium.

4. A method according to claim 1, wherein the application of said first layer is discontinued when the optical thickness thereof attains a chosen value corresponding to a preselected outward appearance for the reflection colour of the glazing, 20 nm corresponding to the colour "silver", 80 nm to the colour "bronze", 200 nm to the colour "blue" and 240 nm to the colour "green".

5. A method according to claim 1, wherein the application of said chromium nitride layer is discontinued when the geometric thickness thereof attains a value corresponding to a preselected transmission value for the glazing, 19 nm corresponding to a transmission of 15%, and 12 nm to a transmission of 30%.

6. A method according to claim 1, including the step of predetermining the infra-red reflection value of the glazing by selecting a gas composition in the range inert gas:nitrogen=0.20 to 0.90 when applying the chromium nitride layer by cathode sputtering, I.R. reflection of 10% being obtained when Ar:$N_2$=0.20, and an I.R. reflection of 45% when Ar:$N_2$=0.60.

7. A window pane having a transmission of between 5 and 40% in the visual spectrum range and having heat-reflection properties, comprising a glass pane, a first oxide layer which is located on the glass pane and has an optical thickness of between 20 and 280 nm, and a second, chromium nitride layer having a geometric thickness of between 10 and 40 nm.

* * * * *